US012787779B2

(12) United States Patent
Zheng et al.

(10) Patent No.: US 12,787,779 B2
(45) Date of Patent: Nov. 3, 2026

(54) MEMORIES AND FABRICATION METHODS THEREOF, MEMORY SYSTEMS, AND ELECTRONIC DEVICES

(71) Applicant: Yangtze Memory Technologies Co., Ltd., Wuhan (CN)

(72) Inventors: Hao Zheng, Wuhan (CN); Dongyu Fan, Wuhan (CN); Lei Liu, Wuhan (CN); ZhiLiang Xia, Wuhan (CN); ZhongLiang Huo, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 373 days.

(21) Appl. No.: 18/468,439

(22) Filed: Sep. 15, 2023

(65) Prior Publication Data

US 2024/0379497 A1 Nov. 14, 2024

(30) Foreign Application Priority Data

May 11, 2023 (CN) ......................... 202310532472.0

(51) Int. Cl.

| | |
|---|---|
| ***H10W 40/47*** | (2026.01) |
| ***H10W 20/00*** | (2026.01) |
| ***H10W 20/41*** | (2026.01) |
| ***H10W 20/42*** | (2026.01) |
| ***H10W 40/43*** | (2026.01) |

(52) U.S. Cl.

CPC ......... *H10W 40/47* (2026.01); *H10W 20/043* (2026.01); *H10W 20/42* (2026.01); *H10W 20/435* (2026.01); *H10W 40/43* (2026.01)

(58) Field of Classification Search

CPC ............. H01L 23/473; H01L 21/76873; H01L 23/467; H01L 23/5226; H01L 23/5283; H01L 23/367; H01L 21/4803; G11B 33/1413

See application file for complete search history.

(56) References Cited

U.S. PATENT DOCUMENTS

2008/0048235 A1* 2/2008 Tsai ........................ H10D 1/716 257/532

2009/0284921 A1* 11/2009 Colgan ................. H01L 23/473 361/699

2014/0071626 A1* 3/2014 Campbell ............... B23P 15/26 165/165

(Continued)

*Primary Examiner* — William B Partridge

*Assistant Examiner* — David Paul Sedorook

(74) *Attorney, Agent, or Firm* — Hanley, Flight & Zimmerman, LLC

(57) ABSTRACT

Examples of the present disclosure disclose a memory and a fabrication method thereof, a memory system, and an electronic device. The memory includes a first semiconductor structure and a second semiconductor structure that are bonded to each other; the first semiconductor structure includes a first dielectric layer and a first conductive pillar located in the first dielectric layer; the second semiconductor structure includes a second dielectric layer and a second conductive pillar located in the second dielectric layer; the second conductive pillar is connected with the first conductive pillar; the memory further includes a heat dissipation channel located in at least one of the first dielectric layer or the second dielectric layer, wherein the heat dissipation channel is disposed as being spaced apart from at least one of the first conductive pillar or the second conductive pillar.

20 Claims, 9 Drawing Sheets

(56) References Cited

U.S. PATENT DOCUMENTS

| | | | | |
|---|---|---|---|---|
| 2015/0262953 | A1* | 9/2015 | Lee | H01L 24/13 257/737 |
| 2018/0082989 | A1* | 3/2018 | Fong | H10D 84/038 |
| 2019/0252325 | A1* | 8/2019 | Chen | H01L 21/6835 |
| 2023/0307318 | A1* | 9/2023 | Lee | H01L 23/3128 |

* cited by examiner

MEMORIES AND FABRICATION METHODS THEREOF, MEMORY SYSTEMS, AND ELECTRONIC DEVICES

CROSS-REFERENCE TO RELATED APPLICATION

This application claims priority to and the benefit of Chinese Patent Application 202310532472.0, filed on May 11, 2023, which is hereby incorporated by reference in its entirety.

TECHNICAL FIELD

Examples of the present disclosure relate to the field of semiconductors, and particularly to memories and a fabrication methods thereof, memory systems, and electronic devices.

BACKGROUND

With the development of semiconductor manufacturing technologies, the development of memories tends towards a higher bit density and a higher integration level.

DETAILED DESCRIPTION

Figure 1:
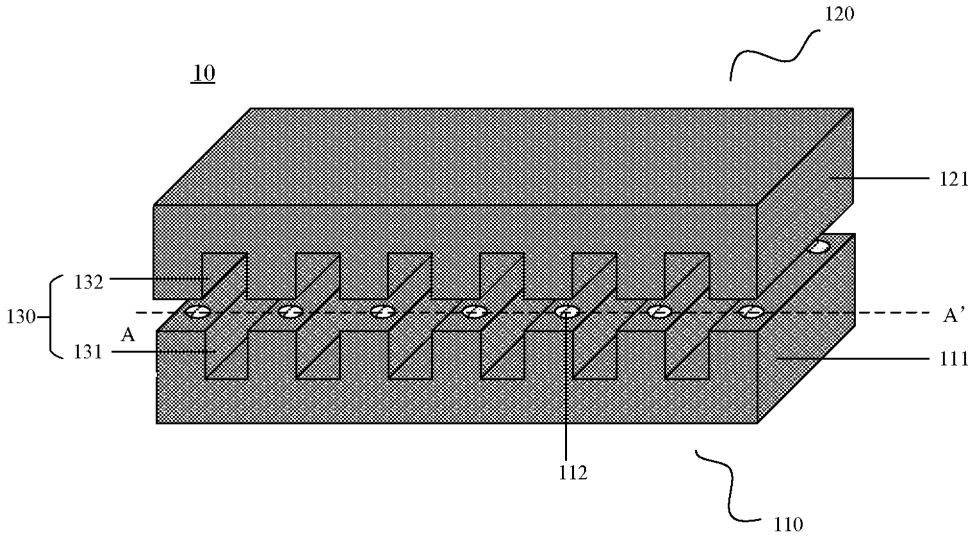
FIG. 1 is a schematic diagram illustrating a memory according to examples of the present disclosure.

However, as the integration level of the memories becomes increasingly high, the heat dissipation problem of the memories becomes increasingly serious. If heat of the memories cannot be dissipated effectively and timely, a high temperature may damage circuits in the memories, thereby affecting the working stability of the memories.

The technical solutions of the present disclosure will be further described below in detail in conjunction with the drawings and examples. Although example implementations of the present disclosure are shown in the drawings, it is to be understood that the present disclosure may be implemented in various forms which should not be limited by the implementations as set forth herein. Rather, these implementations are provided for a more thorough understanding of the present disclosure, and can fully convey the scope of the present disclosure to those skilled in the art.

In the following paragraphs, the present disclosure is described in more details with reference to the drawings by means of examples. Based on the following description and claims, the advantages and features of the present disclosure will be clearer. It should be noted that the drawings are all in a very simplified form and use an imprecise scale, only for convenient and clear auxiliary description of the purpose of the examples of the present disclosure.

In the examples of the present disclosure, the terms "first", "second" and the like are used to distinguish similar objects, and are not necessarily used to describe a specific sequence or sequential order.

It should be noted that the technical solutions set forth in the examples of the present disclosure may be combined arbitrarily in the case of no conflicts.

Heterogeneous integration is a key technical direction for future packaging, highly integrated packaging of a variety of chips requires extension in at least one of a horizontal direction or a vertical direction. As an effective solution for heterogeneous integration in the vertical direction, hybrid bonding is limited by an excessively high temperature of the current hybrid bonding (e.g., 400° C. to 450° C.), which may damage bonded die structures easily.

For example, the current hybrid bonding requires metal copper as a metal connection. The metal copper plays a role of an electrical connection on the one hand and a role of physical bonding on the other hand, and the metal copper requires a temperature of 400° C. to 450° C. to complete regrowth of a lattice structure, so as to enhance bonding strength between the chips. However, the high temperature of 400° C. to 450° C. may cause damage to a circuit device within the chip. Therefore, it is needed to accelerate heat dissipation during bonding to alleviate the device damage.

In view of this, examples of the present disclosure provide a memory and a fabrication method thereof, a memory system, and an electronic device.

Figure 2:
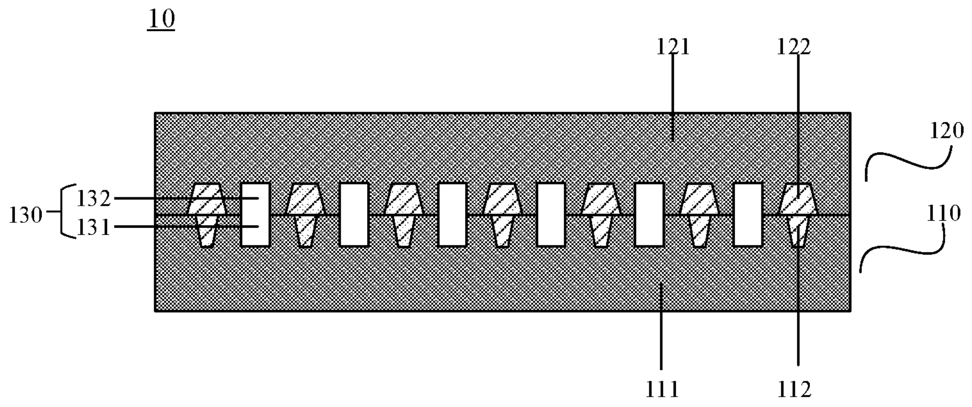
FIG. 2 is a sectional view illustrating a memory according to examples of the present disclosure.
Figure 3A:
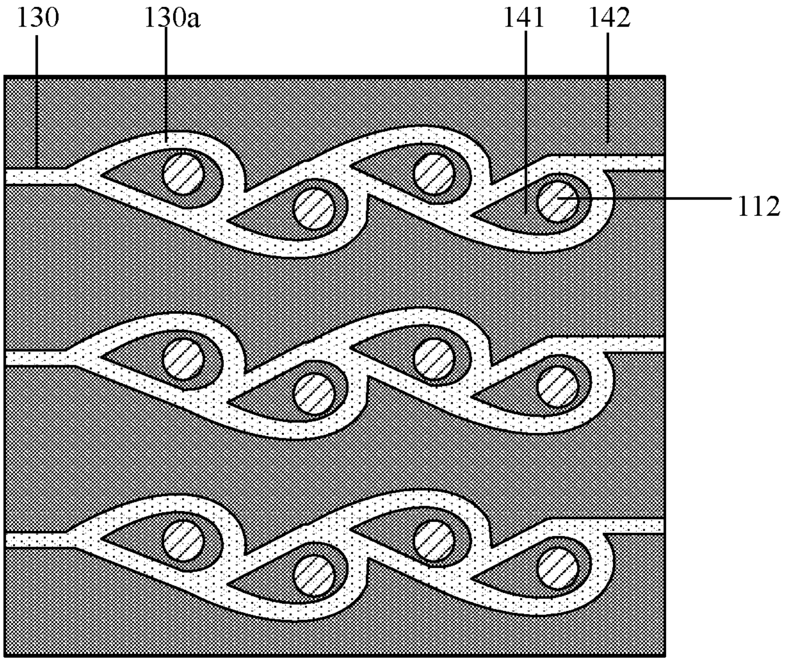
FIGS. 3A to 3C are cross-sectional views illustrating a memory according to examples of the present disclosure.
Figure 3B:
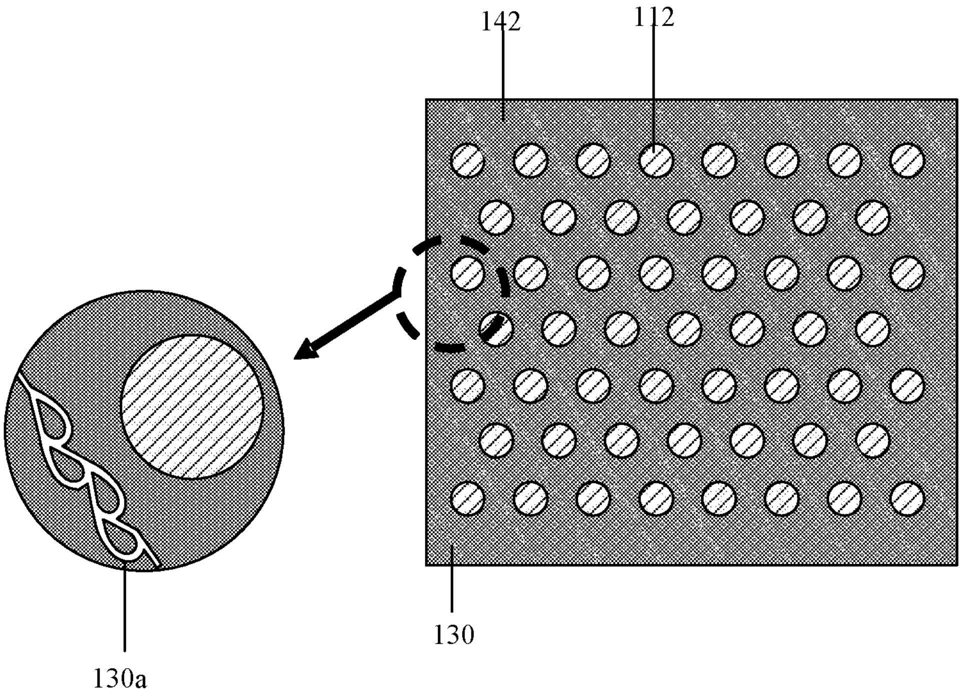
Figure 3C:
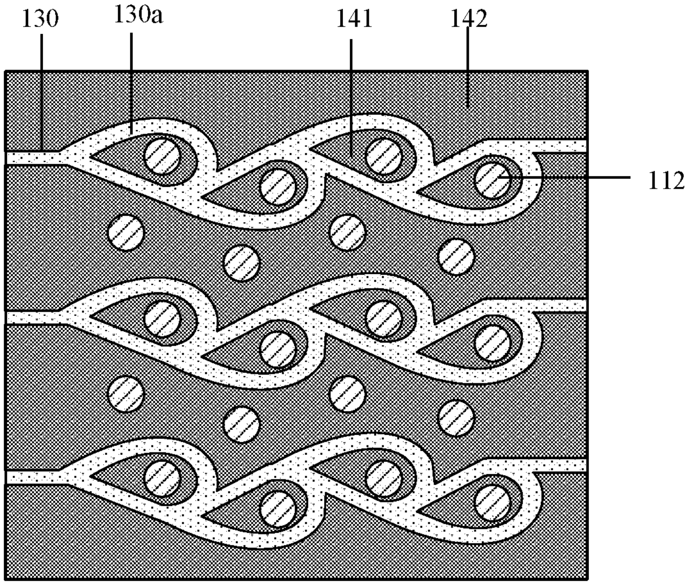
Figure 4A:
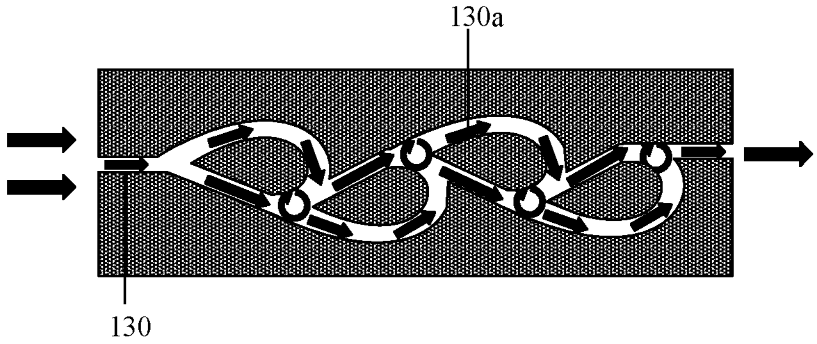
FIGS. 4A and 4B are schematic diagrams illustrating a heat dissipation channel according to examples of the present disclosure.
Figure 4B:
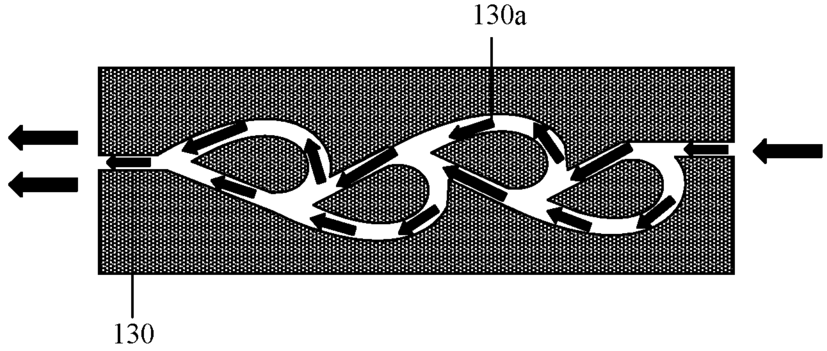

FIG. 1 is a schematic diagram illustrating a memory 10 according to examples of the present disclosure. FIG. 2 is a sectional view of the memory 10 taken along a sectional line AA' in FIG. 1. FIGS. 3A to 3C are cross-sectional views illustrating a memory 10 according to examples of the present disclosure. FIGS. 4A and 4B are schematic diagrams illustrating a heat dissipation channel according to examples of the present disclosure. The memory 10 provided by the examples of the present disclosure will be described below in detail in conjunction with FIGS. 1 to 4B.

Referring to FIGS. 1 and 2, the memory 10 comprises a first semiconductor structure 110 and a second semiconductor structure 120 that are bonded to each other; the first semiconductor structure 110 comprises a first dielectric layer 111 and a first conductive pillar 112 located in the first dielectric layer 111, the second semiconductor structure 120 comprises a second dielectric layer 121 and a second conductive pillar 122 located in the second dielectric layer 121; the second conductive pillar 122 is connected with the first conductive pillar 112;

the memory 10 further comprises a heat dissipation channel 130 located in at least one of the first dielectric layer 111 or the second dielectric layer 121, wherein the heat dissipation channel 130 is disposed as being spaced apart from at least one of the first conductive pillar 112 or the second conductive pillar 122.

The memory 10 comprises: a dynamic random access memory (DRAM), a NAND flash memory, a phase change memory (PCM), or a ferroelectric random access memory (FeRAM), or the like. The memory 10 may also be other types of memories known in the art, which are not enumerated herein.

The first semiconductor structure 110 and the second semiconductor structure 120 comprise wafers or cut wafers, such as dies. In some examples, the second semiconductor structure 120 and the first semiconductor structure 110 may be wafers or dies of the same type. In other examples, the second semiconductor structure 120 and the first semiconductor structure 110 may be wafers or dies of different types.

In a specific example, the first semiconductor structure 110 may be a wafer or a die formed with a memory cell array or a peripheral circuit, and accordingly, the second semiconductor structure 120 may be a wafer or a die formed with a peripheral circuit or a memory cell array. A bonding manner between the first semiconductor structure 110 and the second semiconductor structure 120 comprises: wafer to wafer bonding, die to wafer bonding, or die to die bonding, or the like.

Materials of the first dielectric layer 111 and the second dielectric layer 121 include silicon oxide, silicon nitride, or silicon oxynitride, or the like. The first dielectric layer 111 and the second dielectric layer 121 each may be a single film layer or a composite film layer consisting of a plurality of film layers. The materials of the first dielectric layer 111 and the second dielectric layer 121 may be the same or different, film layer compositions of the first dielectric layer 111 and the second dielectric layer 121 may be the same or different, which are not particularly limited in the present disclosure.

In some examples, the first semiconductor structure 110 comprises a first functional circuit (not shown in the figure), the first functional circuit is located in the first dielectric layer 111, and the first functional circuit comprises a memory cell array (or a peripheral circuit); the second semiconductor structure 120 comprises a second functional circuit (not shown in the figure), the second functional circuit is located in the second dielectric layer 121, and the second functional circuit comprises a peripheral circuit (or a memory cell array).

In a specific example, the first functional circuit comprises a memory cell array, the second functional circuit comprises a peripheral circuit, the first conductive pillar 112 is coupled with the memory cell array, the second conductive pillar 122 is coupled with the peripheral circuit. That is, the memory cell array is coupled with the peripheral circuit through the connected first conductive pillar 112 and second conductive pillar 122.

The first conductive pillar 112 is located in the first dielectric layer 111, the second conductive pillar 122 is located in the second dielectric layer 121, the second conductive pillar 122 is connected with the first conductive pillar 112 by bonding. Materials of the first conductive pillar 112 and the second conductive pillar 122 include a conductive material, e.g., a metal material such as tungsten, copper, or aluminum, etc.

In some examples, referring to FIG. 2, in a direction parallel to a plane where the first semiconductor structure 110 is located, a size of the second conductive pillar 122 is greater than a size of the first conductive pillar 112, so as to be favorable to increase alignment accuracy between the second conductive pillar 122 and the first conductive pillar 112 when the second conductive pillar 122 and the first conductive pillar 112 are bonded. In other examples, the size of the second conductive pillar 122 may be equal to or less than the size of the first conductive pillar 112.

The bonding of the first semiconductor structure 110 and the second semiconductor structure 120 comprises: bonding of the first dielectric layer 111 and the second dielectric layer 121, and bonding of the first conductive pillar 112 and the second conductive pillar 122.

In an example, the heat dissipation channel 130 is located in the first dielectric layer 111 and disposed as being spaced apart from the first conductive pillar 112. For example, the heat dissipation channel 130 is spaced apart from the first conductive pillar 112 through the first dielectric layer 111. In this example, no heat dissipation channel is disposed in the second dielectric layer 121, heat dissipation can be accelerated to reduce damage to a circuit within the memory caused by a high temperature through the heat dissipation channel 130 in the first dielectric layer 111.

In another example, the heat dissipation channel 130 is located in the second dielectric layer 121 and disposed as being spaced apart from the second conductive pillar 122. For example, the heat dissipation channel 130 is spaced apart from the second conductive pillar 122 through the second dielectric layer 121. In this example, no heat dissipation channel is disposed in the first dielectric layer 111, the heat dissipation can be accelerated to reduce the damage to the circuit in the memory caused by the high temperature through the heat dissipation channel 130 in the second dielectric layer 121.

In yet another example, a portion of the heat dissipation channel 130 is located in the first dielectric layer 111 and disposed as being spaced apart from the first conductive pillar 112, and the other portion of the heat dissipation channel 130 is located in the second dielectric layer 121 and disposed as being spaced apart from the second conductive pillar 122. In this example, the heat dissipation channel 130 is disposed in both the first dielectric layer 111 and the second dielectric layer 121, which can further accelerate the heat dissipation.

In some examples, the memory 10 may undergo the heat dissipation through the heat dissipation channel 130 during fabrication (e.g., the bonding of the first semiconductor structure 110 and the second semiconductor structure 120). In other examples, the memory 10 may undergo the heat dissipation through the heat dissipation channel 130 during working (e.g., performing a logical operation).

In the examples of the present disclosure, the heat dissipation channel spaced apart from the first conductive pillar is disposed in the first dielectric layer of the first semiconductor structure, and/or the heat dissipation channel spaced apart from the second conductive pillar is disposed in the second dielectric layer of the second semiconductor structure, such that the memory may undergo the heat dissipation timely and effectively through the heat dissipation channel, thereby facilitating reduction of the damage to the circuit in the memory caused by the high temperature and ensuring the working stability of the memory.

In some examples, referring to FIG. 2, the heat dissipation channel 130 comprises: a first heat dissipation channel 131 located in the first dielectric layer 111 and disposed as being spaced apart from the first conductive pillar 112; and a second heat dissipation channel 132 located in the second dielectric layer 121 and disposed as being spaced apart from the second conductive pillar 122, wherein the second heat dissipation channel 132 is communicated with the first heat dissipation channel 131.

Here, the first heat dissipation channel 131 is disposed as being spaced apart from the first conductive pillar 112 through the first dielectric layer 111, the second heat dissipation channel 132 is disposed as being spaced apart from the second conductive pillar 122 through the second dielectric layer 121, such that the heat dissipation channel 130 is not in direct contact with the first conductive pillar 112 or the second conductive pillar 122, it is beneficial to protect the first conductive pillar 112 and the second conductive pillar 122 while achieving the heat dissipation of the memory.

The communicating of the second heat dissipation channel 132 and the first heat dissipation channel 131 comprises: full communicating of the second heat dissipation channel 132 and the first heat dissipation channel 131; or partial communicating of the second heat dissipation channel 132 and the first heat dissipation channel 131. For example, FIG. 2 illustrates the full communicating of the second heat dissipation channel 132 and the first heat dissipation channel 131.

In some examples, cross-sectional shapes of the first heat dissipation channel 131 and the second heat dissipation channel 132 are the same or different.

In the examples of the present disclosure, the first heat dissipation channel spaced apart from the first conductive pillar is disposed in the first dielectric layer of the first semiconductor structure, and the second heat dissipation channel spaced apart from the second conductive pillar is disposed in the second dielectric layer of the second semiconductor structure, such that the memory may undergo the heat dissipation through the first heat dissipation channel and the second heat dissipation channel, and it is beneficial to protect the first conductive pillar and the second conductive pillar from the damage.

Moreover, the first heat dissipation channel is communicated with the second heat dissipation channel to further facilitate the heat dissipation.

In some examples, referring to FIG. 2, the first semiconductor structure 110 comprises a plurality of first conductive pillars 112; the second semiconductor structure 120 comprises a plurality of second conductive pillars 122; the heat dissipation channel 130 comprises: at least one first heat dissipation channel 131 located between two adjacent ones of the first conductive pillars 112, and least one second heat dissipation channel 132 located between two adjacent ones of the second conductive pillars 122.

The first heat dissipation channel 131 and the second heat dissipation channel 132 are configured to dissipate heat of the bonded first semiconductor structure 110 and second semiconductor structure 120. In a specific example, the first heat dissipation channel 131 is communicated with the second heat dissipation channel 132. In other examples, the first heat dissipation channel 131 may also be not communicated with the second heat dissipation channel 132.

In a specific example, the first heat dissipation channel 131 is disposed between two adjacent ones of the first conductive pillars, and the second heat dissipation channel 132 is disposed between two adjacent ones of the second conductive pillars, which are favorable to further enhance a heat dissipation effect of the heat dissipation channel 130 on the memory 10.

In some examples, a plurality of second heat dissipation channels 132 and a plurality of first heat dissipation channels 131 are disposed in one-to-one correspondence and are all communicated. Alternatively, a part of the second heat dissipation channels 132 is communicated with a part of the first heat dissipation channels 131, while the other part of the second heat dissipation channels 132 is not communicated with the other part of the first heat dissipation channels 131. For example, FIG. 2 illustrates the plurality of second heat dissipation channels 132 and the plurality of first heat dissipation channels 131 which are all communicated.

It should be noted that the numbers of the first conductive pillars 112 and the second conductive pillars 122 are not limited particularly, the numbers of the first heat dissipation channels 131 and the second heat dissipation channels 132 are not limited particularly either. These numbers may be one, two, or more, and may be set by those skilled in the art according to actual needs, which is not limited herein in the present disclosure.

In some examples, the numbers of the first heat dissipation channels 131 and the second heat dissipation channels 132 may be the same. In other examples, the numbers of the first heat dissipation channels 131 and the second heat dissipation channels 132 may be different.

In the examples of the present disclosure, at least one first heat dissipation channel located between two adjacent ones of the first conductive pillars and at least one second heat dissipation channel located between two adjacent ones of the second conductive pillars are disposed, such that at least one of the number of the first heat dissipation channels or the number of the second heat dissipation channels in the memory may be reasonably set according to actual heat dissipation needs, thereby increasing flexibility of a memory design while accelerating the heat dissipation.

In some examples, the heat dissipation channel 130 further comprises: at least one third heat dissipation channel (not shown in the figure) located in the first dielectric layer 111 and between two adjacent ones of the first conductive pillars 112, wherein an extension direction of the third heat dissipation channel intersects an extension direction of the first heat dissipation channel 131; and at least one fourth heat dissipation channel (not shown in the figure) located in the second dielectric layer 121 and between two adjacent ones of the second conductive pillars 122, the fourth heat dissipation channels being communicated with the third heat dissipation channels, wherein an extension direction of the fourth heat dissipation channels intersects an extension direction of the second heat dissipation channels 132.

Here, the third heat dissipation channels are disposed as being spaced apart from the first conductive pillars 112 through the first dielectric layer 111, the fourth heat dissipation channels are disposed as being spaced apart from the second conductive pillars 122 through the second dielectric layer 121, such that the heat dissipation channel is not in direct contact with the first conductive pillars 112 or the second conductive pillars 122.

The communicating of the fourth heat dissipation channels and the third heat dissipation channel comprises: full communicating of the fourth heat dissipation channels and the third heat dissipation channels; or partial communicating of the fourth heat dissipation channels and the third heat dissipation channels. The third heat dissipation channels may be communicated with or may not be communicated with the first heat dissipation channels 131, the fourth heat dissipation channel may be communicated with or may not be communicated with the second heat dissipation channel 132. Here, when the first heat dissipation channels (or the second heat dissipation channels) and the third heat dissipation channels (or the fourth heat dissipation channels) located in the same dielectric layer are communicated, the first heat dissipation channels intersect the third heat dissipation channels.

In some examples, cross-sectional shapes of the third heat dissipation channels and the fourth heat dissipation channels are the same or different.

In a specific example, the numbers of the third heat dissipation channels and the fourth heat dissipation channels may be the same. In other examples, the numbers of the third heat dissipation channels and the fourth heat dissipation channels may be different. The numbers of the third heat dissipation channels and the fourth heat dissipation channels are not limited particularly, may be one, two, or more, may be set by those skilled in the art according to actual needs, which is not limited herein in the present disclosure.

In the examples of the present disclosure, the third heat dissipation channels intersecting the extension direction of the first heat dissipation channels are disclosed in the first dielectric layer, and the fourth heat dissipation channels intersecting the extension direction of the second heat dissipation channels are disposed in the second dielectric layer, such that the memory may undergo the heat dissipation in a plurality of directions, which is favorable to enhance the heat dissipation effect.

In some examples, referring to FIGS. 3A to 3C, the heat dissipation channel 130 comprises a plurality of annular sub-channels 130*a* connected sequentially; the memory 10 comprises first regions 141 located inside the annular sub-channels 130*a* and second regions 142 located outside the annular sub-channels 130*a*, wherein the connected first conductive pillars 112 and second conductive pillars are located in the first regions 141; and/or the connected first conductive pillars 112 and second conductive pillars are located in the second regions 142.

Here, the plurality of annular sub-channels 130*a* are connected sequentially to form the heat dissipation channel 130, shapes of an inner ring and an outer ring of each of the annular sub-channels 130*a* include, but are not limited to, a "water droplet shape". The inner rings of the annular sub-channels 130*a* may define the first regions, the outer rings of the annular sub-channels 130*a* may define the second regions.

In an example, referring to FIG. 3A, the connected first conductive pillars 112 and second conductive pillars are located in the first regions 141, the connected first conductive pillars 112 and second conductive pillars are enclosed by the annular sub-channels 130*a*, which can reduce planar sizes of the first semiconductor structure 110 and the second semiconductor structure 120 while improving the heat dissipation effect, thereby facilitating optimization of a layout of the memory and achieving miniaturization of the memory.

In another example, referring to FIG. 3B, the connected first conductive pillars 112 and second conductive pillars are located in the second regions 142, a plurality of heat dissipation channels 130 are arranged in juxtaposition along a first direction, each of the heat dissipation channels 130 extends along a second direction. The first direction and the second direction are both parallel to the plane where the first semiconductor structure 110 is located, the first direction intersects the second direction. The plurality of connected first conductive pillars 112 and second conductive pillars are located on two sides of the heat dissipation channel 130, i.e., located in the second regions 142 outside the annular sub-channels 130*a*.

In yet another example, referring to FIG. 3C, the connected first conductive pillars 112 and second conductive pillars are located in the first regions 141 and the second regions 142, the plurality of heat dissipation channels 130 are arranged in juxtaposition along the first direction, each of the heat dissipation channel 130 extends along the second direction. A part of the connected first conductive pillars 112 and second conductive pillars are located on two sides of the heat dissipation channel 130, i.e., located in the second regions 142 outside the annular sub-channels 130*a*, and the other part of the connected first conductive pillars 112 and second conductive pillars are located in the first regions 141 inside the annular sub-channels 130*a*.

Here, the first heat dissipation channels in the first semiconductor structure may be distributed in at least one of the first regions or the second regions, the second heat dissipation channels in the second semiconductor structure may be distributed in at least one of the first regions or the second regions. For case of understanding. FIGS. 3A to 3C just illustrate an example structure of the heat dissipation channels in the examples of the present disclosure. Those skilled in the art may arbitrarily combine structures of the first heat dissipation channels and the second heat dissipation channels according to actual needs, which is not limited particularly in the present disclosure.

It should be noted that FIGS. 3A to 3C illustrate only the first conductive pillars 112. It should be understood that, as shown in conjunction with FIG. 2, the size of the second conductive pillar 122 is greater than the size of the first conductive pillar 112, an orthographic projection of the first conductive pillar 112 is within an orthographic projection of the second conductive pillar 122, orthographic projection area of the second conductive pillar 122 is greater than orthographic projection area of the first conductive pillar 112.

In some examples, a width of the heat dissipation channel 130 is substantially the same as a width of the first conductive pillar 112 or a width of the second conductive pillar 122, such that the width of the heat dissipation channel 130 is increased as large as possible to be favorable to increase a fluid flux, thereby enhancing the heat dissipation effect.

In some other examples, the width of the heat dissipation channel 130 is less than the width of the first conductive pillar 112 or the width of the second conductive pillar 122. For example, when the connected first conductive pillar 112 and second conductive pillar in FIG. 3B are located in the second region 142, a planar size of the memory may be reduced by reducing the width of the heat dissipation channel 130, which is favorable to the miniaturization of the memory. Of course, in other examples, the width of the heat dissipation channel 130 may be greater than the width of the first conductive pillar 112 or the width of the second conductive pillar 122.

In some examples, referring to FIGS. 4A and 4B, the heat dissipation channel 130 comprises a micro Tesla valve structure which has characteristics of forward fluid acceleration (as shown in FIG. 4B) and reverse fluid blockage (as shown in FIG. 4A). The heat dissipation channel 130 is configured as the micro Tesla valve structure, which is favorable to accelerate the heat dissipation in the heat dissipation channel, effectively reduces heat damage to a circuit device caused by the high temperature, and can prevent backflow and avoid a heat dissipation medium introduced into the heat dissipation channel from sticking due to surface tension, thereby achieving a better heat dissipation effect. Of course, in other examples, the heat dissipation channel 130 may also comprise other structures, such as a fin structure.

In an example, when the first semiconductor structure 110 comprises the third heat dissipation channel intersecting the extension direction of the first heat dissipation channel 131, flow directions of heat dissipation media in the third heat dissipation channel and the first heat dissipation channel 131 are the same.

In an example, when the second semiconductor structure 120 comprises the fourth heat dissipation channel intersecting the extension direction of the second heat dissipation channel 132, flow directions of heat dissipation media in the fourth heat dissipation channel and the second heat dissipation channel 132 are the same.

In some examples, the heat dissipation channel 130 comprises: a gap or a plastic molding dielectric.

In an example, the heat dissipation channel 130 is filled with the plastic molding dielectric, a material of the plastic molding dielectric comprises epoxy resin, an organosilicon material, a polyimide material, or a ceramic material, or the like.

In another example, the heat dissipation channel 130 may not be filled with the plastic molding dielectric, with the gap retained, so as to perform heat dissipation during subsequent fabrication or working of the memory.

Figure 5:
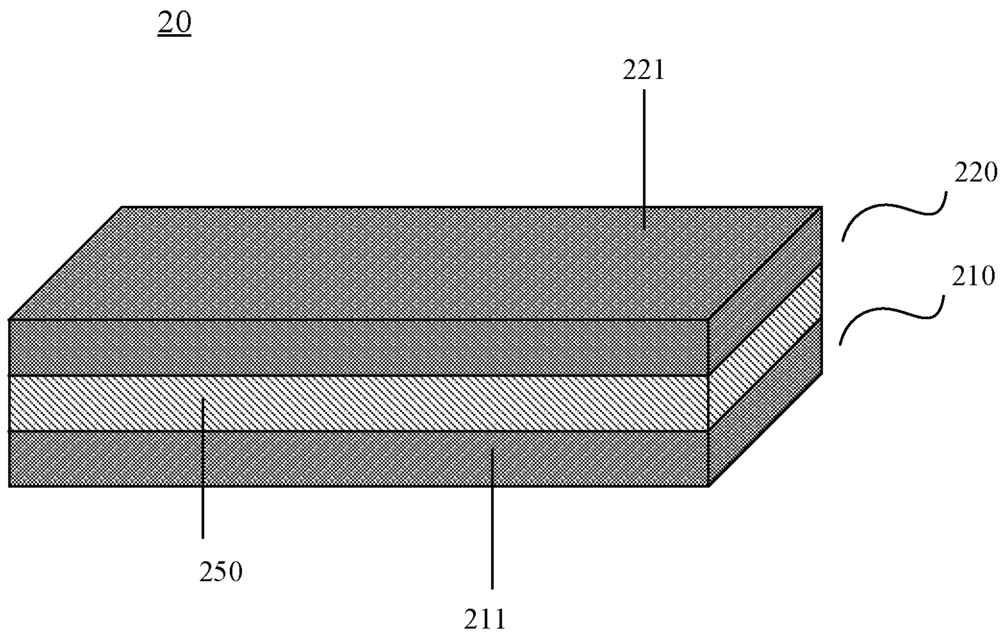
FIG. 5 is a schematic diagram illustrating another memory according to examples of the present disclosure.

FIG. 5 is a schematic diagram illustrating another memory 20 according to examples of the present disclosure. A first semiconductor structure 210, a second semiconductor structure 220, a first dielectric layer 211, and a second dielectric layer 221 in FIG. 5 may be similar to the structures illustrated in the above examples, and are no longer repeated herein. A difference from FIG. 1 lies in that, part of the first conductive pillar is located in the first dielectric layer 211, part of the second conductive pillar is located in the second dielectric layer 212; the memory 20 further comprises a filling layer 250 between the first dielectric layer 211 and the second dielectric layer 221, a connection face of the first conductive pillar and the second conductive pillar is located in the filling layer 250.

In some examples, the filling layer 250 is formed by replacing a heat conduction structure between the first dielectric layer 211 and the second dielectric layer 221. Here, the heat conduction structure is an intermediate film layer in a fabrication process of the memory 20, that is, the heat conduction structure will be removed in a subsequent fabrication process and replaced with the filling layer 250. The heat conduction structure will be further described in the following examples and is no longer repeated here.

In some examples, referring to FIG. 5, the first conductive pillar comprises a first conductive sub-pillar and a second conductive sub-pillar, the first conductive sub-pillar is located in the first dielectric layer 211, the second conductive sub-pillar is located in the filling layer 250; the second conductive pillar comprises a third conductive sub-pillar and a fourth conductive sub-pillar, the third conductive sub-pillar is located in the second dielectric layer 221, the fourth conductive sub-pillar is located in the filling layer 250.

It should be noted that the first conductive sub-pillar and the second conductive sub-pillar may be different portions of a continuous film layer or may be two film layers. Similarly, the third conductive sub-pillar and the fourth conductive sub-pillar may be different portions of a continuous film layer or may be two film layers. Those skilled in the art can perform distinguishing according to an actual process.

The filling layer 250 is configured to provide support, a material of the filling layer 250 comprises a material with good fluidity, such as at least one of epoxy resin, polyimide, or silica gel.

Figure 6:
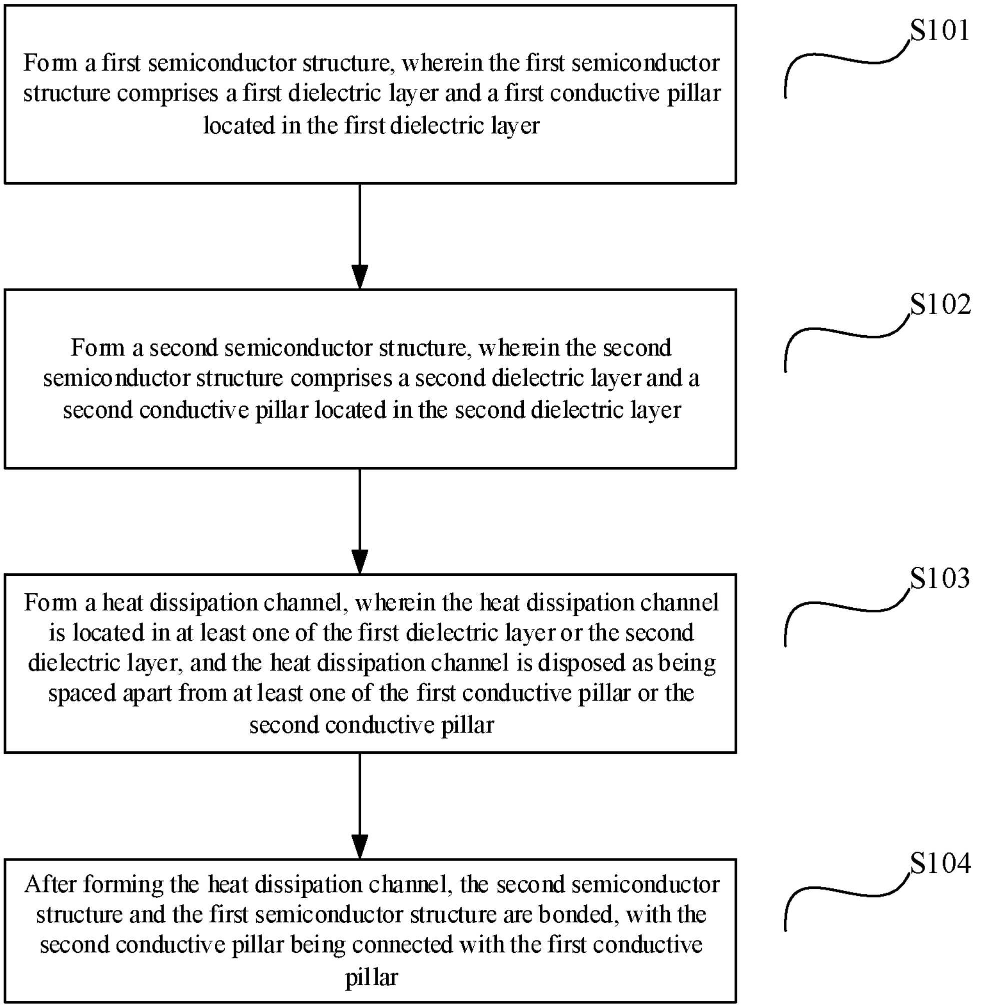
FIG. 6 is a flow chart illustrating a fabrication method of a memory according to examples of the present disclosure.

FIG. 6 is a flow chart illustrating a fabrication method of a memory according to examples of the present disclosure. Referring to FIG. 6, the fabrication method at least comprises the following operations:

- S101: forming a first semiconductor structure, wherein the first semiconductor structure comprises a first dielectric layer and a first conductive pillar located in the first dielectric layer;
- S102: forming a second semiconductor structure, wherein the second semiconductor structure comprises a second dielectric layer and a second conductive pillar located in the second dielectric layer;
- S103: forming a heat dissipation channel, wherein the heat dissipation channel is located in at least one of the first dielectric layer or the second dielectric layer, and the heat dissipation channel is disposed as being spaced apart from at least one of the first conductive pillar or the second conductive pillar; and
- S104: after forming the heat dissipation channel, bonding the second semiconductor structure and the first semiconductor structure, with the second conductive pillar being connected with the first conductive pillar.

It should be noted that the operations as illustrated in FIG. 6 are not exclusive, other operations may also be performed before, after, or between any of the illustrated operations. A sequence of the operations illustrated in FIG. 6 can be adjusted according to actual needs.

FIGS. 7A to 7D are schematic diagrams illustrating a fabrication process of a memory 10 according to examples of the present disclosure. The fabrication method of the memory provided by the examples of the present disclosure will be described in detail below in conjunction with FIG. 6 and FIGS. 7A to 7D.

Figure 7A:
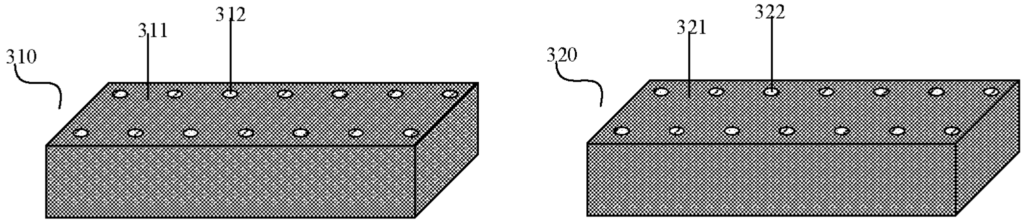
FIGS. 7A to 7D are schematic diagrams illustrating a fabrication process of a memory according to examples of the present disclosure.

In operation S101 and operation S102, referring to FIG. 7A, a first semiconductor structure 310 is formed, wherein the first semiconductor structure 310 comprises a first dielectric layer 311 and a first conductive pillar 312 located in the first dielectric layer 311; a second semiconductor structure 320 is formed, wherein the second semiconductor structure 320 comprises a second dielectric layer 321 and a second conductive pillar 322 located in the second dielectric layer 321.

The first semiconductor structure 310 comprises a memory cell array (or a peripheral circuit), the first conductive pillar 312 is coupled with the memory cell array; the second semiconductor structure 320 comprises a peripheral circuit (or a memory cell array), the second conductive pillar 322 is coupled with the peripheral circuit, that is, the memory cell array and the peripheral circuit in the memory are coupled through the connected first conductive pillar 312 and the second conductive pillar 322.

The first semiconductor structure 310 and the second semiconductor structure 320 comprise wafers or cut wafers, such as dies. In some examples, the second semiconductor structure 320 and the first semiconductor structure 310 may be wafers or dies of the same type. In other examples, the second semiconductor structure 320 and the first semiconductor structure 310 may be wafers or dies of different types.

Materials of the first dielectric layer 311 and the second dielectric layer 321 comprise: silicon oxide, silicon nitride, or silicon oxynitride, or the like, the first dielectric layer 311 and the second dielectric layer 321 each may be a single film layer or a composite film layer consisting of a plurality of film layers. The materials of the first dielectric layer 311 and the second dielectric layer 321 may be the same or different, film layer compositions of the first dielectric layer 311 and the second dielectric layer 321 may be the same or different, which are not particularly limited in the present disclosure.

In some examples, the above operation S101 comprises: forming the first dielectric material layer 311 covering a first substrate; forming a first via in the first dielectric layer 311; and filling a conductive material in the first via to form the first conductive pillar 312. The conductive material comprises a metal material such as tungsten, copper, or aluminum, etc. Here, other film layers and circuits or interconnection structures located in the film layers may also be present between the first substrate and the first dielectric layer.

In some examples, the above operation S102 comprises: forming the second dielectric material layer 321 covering a second substrate; forming a second via in the second dielectric layer 321; and filling a conductive material in the second via to form the second conductive pillar 322. The conductive material comprises a metal material such as tungsten, copper, or aluminum, etc. Here, other film layers and circuits or interconnection structures located in the film layers may also be present between the second substrate and the second dielectric layer.

It should be noted that the conductive material filled in the first via and the conductive material filled in the second via may be the same or different. Those skilled in the art can make a choice according to actual needs, which is not particularly limited in the present disclosure.

Materials of the first substrate and the second substrate comprise: an elemental semiconductor material (e.g., silicon or germanium), a group III-V compound semiconductor material, a group II-VI compound semiconductor material, an organic semiconductor material or other semiconductor materials known in the art. In other examples, the substrate may also comprise silicon on insulator, etc.

A formation process of the first dielectric layer 311 and the second dielectric layer 321 comprises a thin film deposition process, including: chemical vapor deposition (CVD), physical vapor deposition (PVD), atomic layer deposition (ALD), or combinations thereof.

A formation process of the first via and the second via comprises an etching process, including: dry etching, wet etching, or a combination thereof.

In some examples, in a direction parallel to a plane where the first semiconductor structure 310 is located, a size of the second via is greater than a size of the first via. Therefore, a size of the formed second conductive pillar 322 is greater than a size of the first conductive pillar 312. In other examples, the size of the second via may be equal to or less than the size of the first via.

Figure 7B:
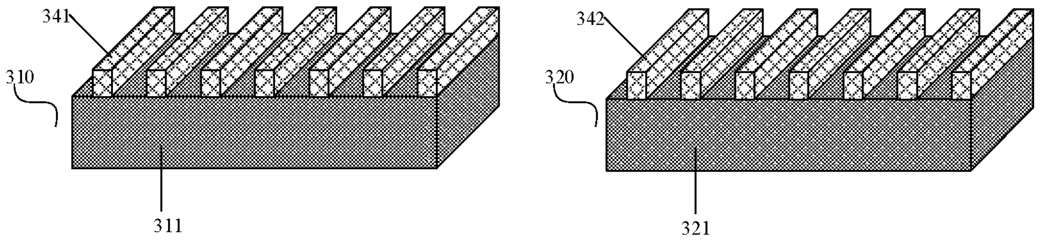
Figure 7C:
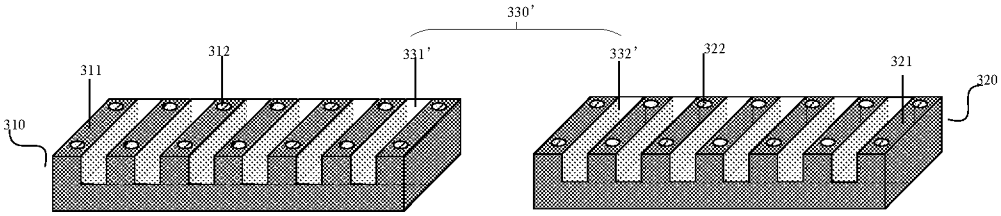
Figure 7D:
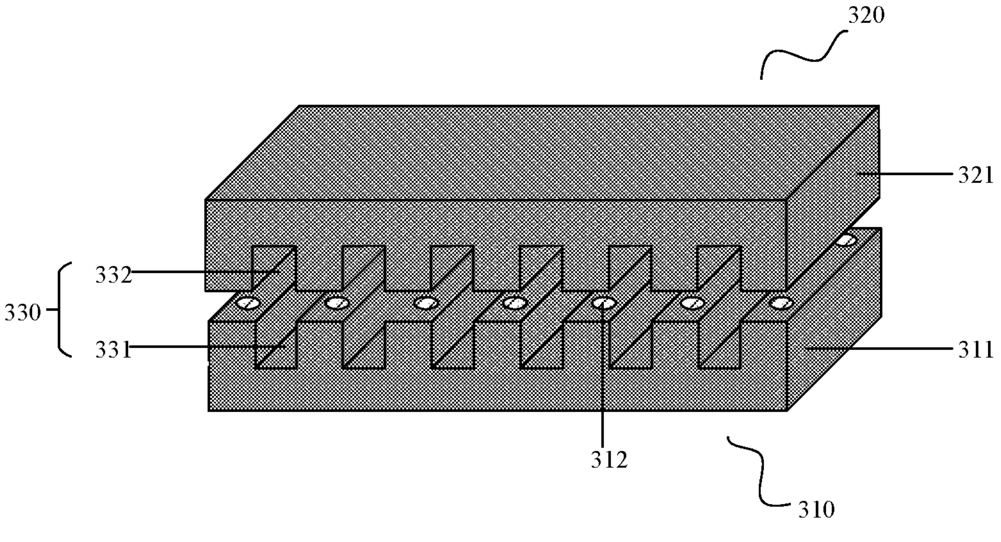

In operation S103, referring to FIGS. 7B to 7D, the heat dissipation channel 330 is formed, wherein the heat dissipation channel 330 is located in at least one of the first dielectric layer 311 or the second dielectric layer 321, the heat dissipation channel 330 is disposed as being spaced apart from at least one of the first conductive pillar 312 or the second conductive pillar 322.

In an example, referring to FIGS. 7B and 7C, the first dielectric layer 311 is etched down based on a patterned mask layer 341 to form a first heat dissipation groove 331', with a bottom of the first heat dissipation groove 331' being located in the first dielectric layer 311. Here, the first heat dissipation groove 331' is used to form the heat dissipation channel 330 in a subsequent fabrication process.

In another example, referring to FIGS. 7B and 7C, the second dielectric layer 321 is etched down based on a patterned mask layer 342 to form a second heat dissipation groove 332', with a bottom of the second heat dissipation groove 332' being located in the second dielectric layer 321. Here, the second heat dissipation groove 332' is used to form the heat dissipation channel 330 in a subsequent fabrication process.

In yet another example, referring to FIGS. 7B and 7C, the first dielectric layer 311 is etched down based on a patterned mask layer 341 to form a first heat dissipation groove 331', with a bottom of the first heat dissipation groove 331' being located in the first dielectric layer 311; the second dielectric layer 321 is etched down based on a patterned mask layer 342 to form a second heat dissipation groove 332', with a bottom of the second heat dissipation groove 332' being located in the second dielectric layer 321. Here, the first heat dissipation groove 331' and the second heat dissipation groove 332' are used to form the heat dissipation channel 330 in a subsequent fabrication process.

A formation process of the patterned mask layers 341 and 342 comprises lithography and etching processes, such as exposure and development processes.

In some examples, referring to FIGS. 7B to 7D, the above operation S103 comprises: forming a first heat dissipation channel 331 located in the first dielectric layer 311 and disposed as being spaced apart from the first conductive pillar 312; and forming a second heat dissipation channel 332 located in the second dielectric layer 321 and disposed as being spaced apart from the second conductive pillar 322, wherein the second heat dissipation channel 332 is communicated with the first heat dissipation channel 331.

In an example, after bonding the second semiconductor structure 320 and the first semiconductor structure 310, the first heat dissipation groove 331' is retained and serves as the first heat dissipation channel 331. In other examples, a plastic molding dielectric may be also filled in the first heat dissipation groove 331'.

In an example, after bonding the second semiconductor structure 320 and the first semiconductor structure 310, the second heat dissipation groove 332' is retained and serves as the second heat dissipation channel 332. In other examples, a plastic molding dielectric may be also filled in the second heat dissipation groove 332'.

The communicating of the second heat dissipation channel 332 and the first heat dissipation channel 331 comprises: full communicating of the second heat dissipation channel 332 and the first heat dissipation channel 331; or partial communicating of the second heat dissipation channel 332 and the first heat dissipation channel 331.

In operation S104, referring to FIG. 7D, after forming the heat dissipation channel 330, the second semiconductor structure 320 and the first semiconductor structure 310 are bonded, with the second conductive pillar being connected with the first conductive pillar 312.

In some examples, at least one of the first semiconductor structure 310 and the second semiconductor structure 320 is inverted. For example, in FIG. 7D, the second semiconductor structure 320 is inverted so that the second substrate faces upwards, the second dielectric layer 321 is aligned with the first dielectric layer 311, the second conductive pillar 322 is aligned with the first conductive pillar 312, and then the second semiconductor structure 320 and the first semiconductor structure 310 are bonded.

In some examples, in the direction parallel to the plane where the first semiconductor structure 310 is located, the size of the second conductive pillar 322 is greater than the size of the first conductive pillar 312, which is favorable to increase alignment accuracy between the second conductive pillar 322 and the first conductive pillar 312 during bonding between the second conductive pillar 322 and the first conductive pillar 312.

In some examples, the above fabrication method further comprises: introducing a heat dissipation medium into the heat dissipation channel 330. For example, during the bonding of the first semiconductor structure 310 and the second semiconductor structure 320, introducing the heat dissipation medium into the heat dissipation channel 330 may reduce damage to the first semiconductor structure 310 and the second semiconductor structure 320 caused by the high temperature during the bonding.

In some examples, the heat dissipation medium comprises: a gas or a liquid.

In some examples, the heat dissipation medium comprises a gas such as hydrogen, helium, or carbon monoxide, etc. In other examples, the heat dissipation medium comprises a liquid such as water or ethylene glycol, etc.

In some examples, the above fabrication method further comprises: controlling a flow rate of the introduced the heat dissipation medium according to a temperature of at least one of the first semiconductor structure 310 and the second semiconductor structure 320.

For example, when it is detected that the temperature of at least one of the first semiconductor structure 310 and the second semiconductor structure 320 is greater than a bonding temperature, the flow rate of the introduced heat dissipation medium may be increased to avoid a heat loss caused by the high temperature.

For another example, when it is detected that the temperature of at least one of the first semiconductor structure 310 and the second semiconductor structure 320 is less than the bonding temperature, the flow rate of the introduced heat dissipation medium may be reduced to avoid an impact of the excessively low temperature on a bonding effect.

Here, those skilled in the art can select the flow rate of the introduced heat dissipation medium according to actual needs, which is not limited herein in the present disclosure.

In some examples, the above fabrication method further comprises: forming a plastic molding dielectric in the communicated first heat dissipation channel 331 and the second heat dissipation channel 332.

In an example, after the first semiconductor structure 310 and the second semiconductor structure 320 are bonded, the plastic molding dielectric may be filled in the communicated first heat dissipation channel 331 and the second heat dissipation channel 332. The plastic molding dielectric comprises epoxy resin, an organosilicon material, a polyimide material, or a ceramic material, or the like.

In another example, after the first semiconductor structure 310 and the second semiconductor structure 320 are bonded, the first heat dissipation channel 331 and the second heat dissipation channel 332 may be retained, that is, the heat dissipation channels are gaps for performing heat dissipation during subsequent fabrication or working of the memory.

Figure 8:
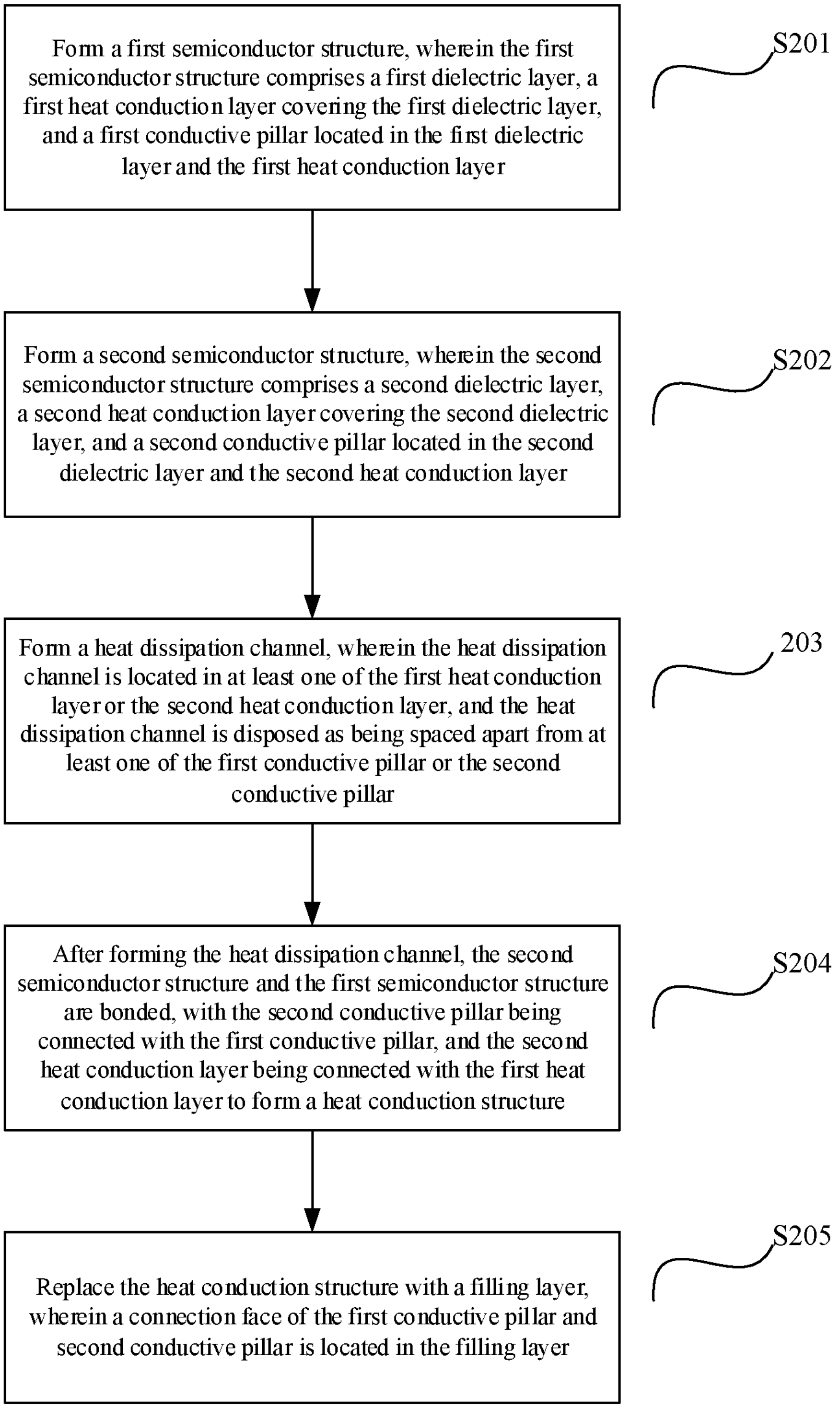
FIG. 8 is a flow chart illustrating another fabrication method of a memory according to examples of the present disclosure.

FIG. 8 is a flow chart illustrating another fabrication method of a memory according to examples of the present disclosure. Referring to FIG. 8, the fabrication method at least comprises the following operations:

- S201: forming a first semiconductor structure, wherein the first semiconductor structure comprises a first dielectric layer, a first heat conduction layer covering the first dielectric layer, and a first conductive pillar located in the first dielectric layer and the first heat conduction layer;
- S202: forming a second semiconductor structure, wherein the second semiconductor structure comprises a second dielectric layer, a second heat conduction layer covering the second dielectric layer, and a second conductive pillar located in the second dielectric layer and the second heat conduction layer;
- S203: forming a heat dissipation channel, wherein the heat dissipation channel is located in at least one of the first heat conduction layer or the second heat conduction layer, and the heat dissipation channel is disposed as being spaced apart from at least one of the first conductive pillar or the second conductive pillar;
- S204: after forming the heat dissipation channel, bonding the second semiconductor structure and the first semiconductor structure, with the second conductive pillar being connected with the first conductive pillar, and the second heat conduction layer being connected with the first heat conduction layer to constitute a heat conduction structure; and
- S205: replacing the heat conduction structure with a filling layer, wherein a connection face of the first conductive pillar and second conductive pillar is located in the filling layer.

It should be noted that the operations as illustrated in FIG. 8 are not exclusive, other operations may also be performed before, after, or between any of the illustrated operations. A sequence of the operations illustrated in FIG. 8 can be adjusted according to actual needs.

FIGS. 9*a* to 9*h* are schematic diagrams illustrating another fabrication process of a memory 20 according to examples of the present disclosure. The fabrication method of the memory provided by the examples of the present disclosure will be described in detail below in conjunction with FIG. 8 and FIGS. 9*a* to 9*h*.

Figure 9A:
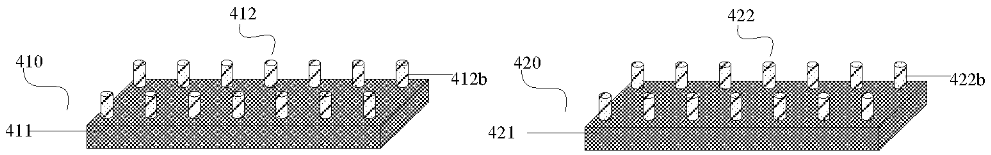
FIGS. 9*a* to 9*h* are schematic diagrams illustrating another fabrication process of a memory according to examples of the present disclosure.
Figure 9B:
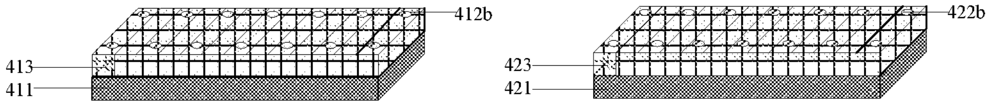
Figure 9C:
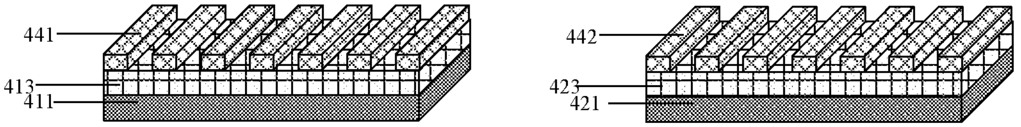

In operations S201 and S202, referring to FIGS. 9*a* and 9*b*, a first semiconductor structure 410 is formed, wherein the first semiconductor structure 410 comprises a first dielectric layer 411, a first heat conduction layer 413 covering the first dielectric layer, and a first conductive pillar 412 located in the first dielectric layer 411 and the first heat conduction layer 413; a second semiconductor structure 420 is formed, wherein the second semiconductor structure 420 comprises a second dielectric layer 421, a second heat conduction layer 423 covering the second dielectric layer, and a second conductive pillar 422 located in the second dielectric layer 421 and the second heat conduction layer 423.

The first semiconductor structure 410 may be similar to the first semiconductor structure 310 in the above examples, the second semiconductor structure 420 may be similar to the second semiconductor structure 320 in the above examples, which are no longer repeated here.

Materials of the first dielectric layer 411 and the second dielectric layer 421 may be similar to the materials of the first dielectric layer 311 and the second dielectric layer 321 in the above examples, which is no longer repeated here.

In some examples, referring to FIGS. 9*a* and 9*b*, the above operation S201 comprises: forming a first via penetrating through the first dielectric layer 411; forming a first conductive sub-pillar (not shown in the figures) in the first via; performing electroplating on the first conductive sub-pillar to form a second conductive sub-pillar 412*b*, wherein the first conductive pillar 412 comprises the first conductive sub-pillar and the second conductive sub-pillar 412*b*; and after forming the second conductive sub-pillar 412*b*, forming the first heat conduction layer 413 covering the first dielectric layer 411. In this example, the second conductive sub-pillar 412*b* is formed by performing electroplating on the first conductive sub-pillar, the first conductive pillar 412 comprises two connected film layers. Here, the first heat conduction layer 413 encases a sidewall of the second conductive sub-pillar 412*b*.

In some examples, referring to FIGS. 9*a* and 9*b*, the above operation S202 comprises: forming a second via penetrating through the second dielectric layer 421; forming a third conductive sub-pillar (not shown in the figures) in the second via; performing electroplating on the third conductive sub-pillar to form a fourth conductive sub-pillar 422*b*, wherein the second conductive pillar 422 comprises the third conductive sub-pillar and the fourth conductive sub-pillar 422*b*; and after forming the fourth conductive sub-pillar 422*b*, forming the second heat conduction layer 423 covering the second dielectric layer 421. In this example, the fourth conductive sub-pillar 422*b* is formed by performing electroplating on the third conductive sub-pillar, the second conductive pillar 422 comprises two connected film layers. The second heat conduction layer 423 encases a sidewall of the fourth conductive sub-pillar 422*b*.

In some examples, in a direction perpendicular to a plane where the first dielectric layer 411 and the second dielectric layer 421 are located, a size of the first heat conduction layer 413 is equal to a size of the second conductive sub-pillar 412*b*, a size of the second heat conduction layer 423 is equal to a size of the fourth conductive sub-pillar 422*b*.

A formation process of the first heat conduction layer 413 and the second heat conduction layer 423 comprises a thin film deposition process. Materials of the first heat conduction layer 413 and the second heat conduction layer 423 comprise silicon nitride, graphene, or an electrothermal alloy material. The materials of the first heat conduction layer 413 and the second heat conduction layer 423 may be the same or different.

In some examples, referring to FIGS. 9*a* and 9*b*, the above operation S201 comprises: forming a first dielectric material layer covering a first substrate; forming a first via penetrating through the first dielectric material layer; forming the first conductive pillar 412 in the first via; removing part of the first dielectric material layer along a direction facing the first substrate, with the remaining first dielectric material layer constituting the first dielectric layer 411; and forming the first heat conduction layer 413 covering the first dielectric layer 411. In this example, the first conductive pillar 412 is a continuous film layer comprising a first portion (i.e. the first conductive sub-pillar) located in the first dielectric layer 411 and a second portion (i.e. the second conductive sub-pillar 412*b*) located in the first heat conduction layer 413.

In some examples, referring to FIGS. 9*a* and 9*b*, the above operation S202 comprises: forming a second dielectric material layer covering a second substrate; forming a second via penetrating through the second dielectric material layer; forming the second conductive pillar 422 in the second via; removing part of the second dielectric material layer along a direction facing the second substrate, with the remaining second dielectric material layer constituting the second dielectric layer 421; and forming the second heat conduction layer 423 covering the second dielectric layer 421. In this example, the second conductive pillar 422 is a continuous film layer comprising a first portion (i.e. the third conductive sub-pillar) located in the second dielectric layer 421 and a second portion (i.e. the fourth conductive sub-pillar 422*b*) located in the second heat conduction layer 423.

Here, materials of the first substrate, the second substrate, the first dielectric material layer, and the second dielectric material layer are similar to the materials of the first substrate, the second substrate, the first dielectric layer, and the second dielectric layer mentioned above, a method of forming the first conductive pillar 412 in the first via and the second conductive pillar 422 in the second via is similar to the method of forming the first conductive pillar 312 in the first via and the second conductive pillar 322 in the second via mentioned above, which are no longer repeated here.

A difference from above operation S101 lies in that, in the examples of the present disclosure, part of the first dielectric material layer is removed first along the direction facing the first substrate, with the remaining first dielectric material layer constituting the first dielectric layer 411, and then the first heat conduction layer 413 covering the first dielectric layer 411 is formed; a difference from above operation S102 lies in that, part of the second dielectric material layer is removed first along the direction facing the second substrate, with the remaining second dielectric material layer constituting the second dielectric layer 421, and then the second heat conduction layer 423 covering the second dielectric layer 421 is formed.

Figure 9D:
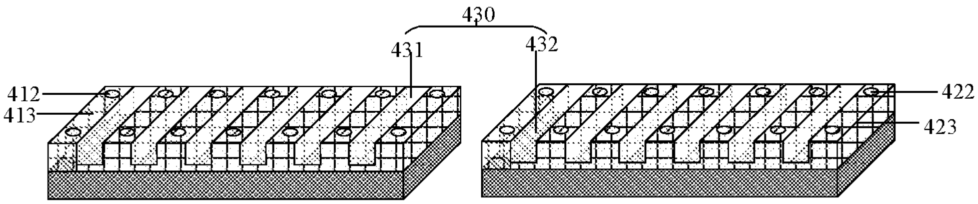

In operation S203, referring to FIG. 9*d*, the heat dissipation channel 430 is formed, wherein the heat dissipation channel 430 is located in at least one of the first heat conduction layer 413 or the second dielectric layer 423, and the heat dissipation channel 430 is disposed as being spaced apart from at least one of the first conductive pillar 412 or the second conductive pillar 422.

Here, a method of forming the heat dissipation channel 430 in at least one of the first heat conduction layer 413 or the second heat conduction layer 423 is similar to the method of forming the heat dissipation channel in at least one of the first dielectric layer 311 or the second dielectric layer 321 in the above operation S103, which is no longer repeated here.

In some examples, as shown in conjunction with FIG. 9*d*, the above operation S203 comprises: forming a first heat dissipation channel 431 located in the first heat conduction layer 413 and disposed as being spaced apart from the first conductive pillar 412; and forming a second heat dissipation channel 432 located in the second heat conduction layer 423 and disposed as being spaced apart from the second conductive pillar 422, wherein the second heat dissipation channel 432 is communicated with the first heat dissipation channel 431. Here, the second heat dissipation channel 432 may be communicated with the first heat dissipation channel 431 after bonding.

Here, a method of forming the first heat dissipation channel 431 in the first heat conduction layer 413 and the second heat dissipation channel 432 in the second heat conduction layer 423 may be similar to the method of forming the first heat dissipation channel 331 in the first dielectric layer 311 and the second heat dissipation channel 332 in the second dielectric layer 321 in the above examples, which is no longer repeated here.

Figure 9E:
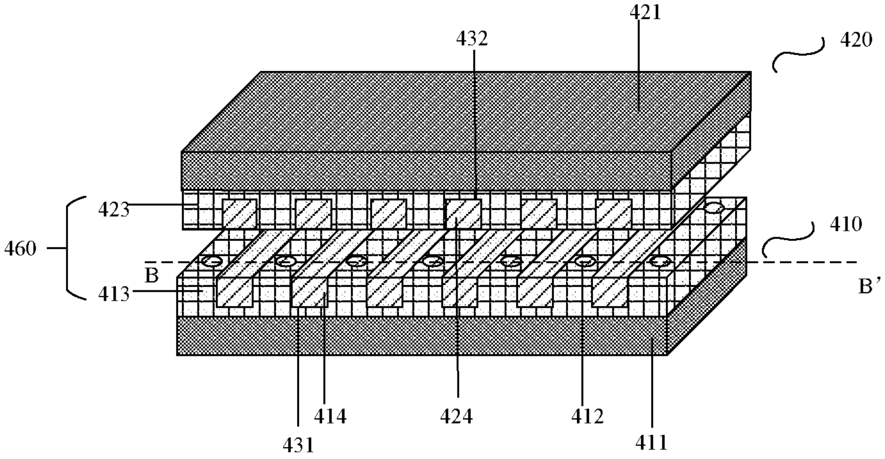

In some examples, referring to FIG. 9*e*, the above fabrication method further comprises: forming a third heat conduction layer 414 in the first heat dissipation channel 431, with a bottom of the third heat conduction layer 414 being located in the first heat conduction layer 413; and forming a fourth heat conduction layer 424 in the second heat dissipation channel 432, with a bottom of the fourth heat conduction layer 424 being located in the second heat conduction layer 423, wherein after bonding the second semiconductor structure 420 and the first semiconductor structure 410, the third heat conduction layer 414 is connected with the fourth heat conduction layer 424.

In some examples, referring to FIG. 9*e*, a heat conduction material is filled in the first heat dissipation channel 431 to form the third heat conduction layer 414, a heat conduction material is filled in the second heat dissipation channel 432 to form the fourth heat conduction layer 424.

The heat conduction material comprises silicon nitride, graphene, or an electrothermal alloy material, materials of at least two of the first heat conduction layer 413, the second heat conduction layer 423, the third heat conduction layer 414, and the fourth heat conduction layer 424 may be the same or different, which is not limited here in the present disclosure.

Figure 9F:
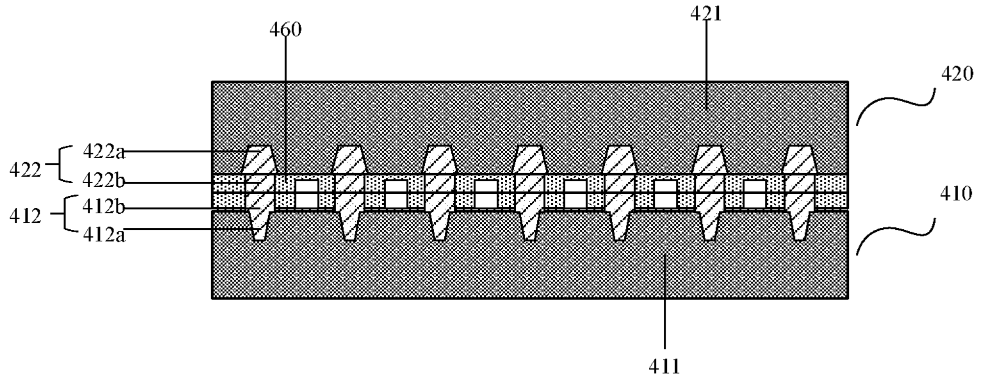

In operation S204, referring to FIGS. 9*e* and 9*f*, after forming the heat dissipation channel 430, the second semiconductor structure 420 and the first semiconductor structure 410 are bonded, with the second conductive pillar 422 being connected with the first conductive pillar 412, and the second heat conduction layer 423 being connected with the first heat conduction layer 413 to constitute a heat conduction structure 460. FIG. 9*f* is a sectional view of the memory 20 taken along a sectional line BB' in FIG. 9*c*.

In some examples, at least one of the first semiconductor structure 410 and the second semiconductor structure 420 is inverted. For example, in FIG. 9*e*, the second semiconductor structure 420 is inverted so that the second substrate faces upwards, the second heat conduction layer 423 is aligned with the first heat conduction layer 413, the second conductive pillar 422 is aligned with the first conductive pillar 412, and then the second semiconductor structure 420 and the first semiconductor structure 410 are bonded, the heat conduction structure 460 is formed after bonding the second heat conduction layer 423 and the first heat conduction layer 413.

Figure 9G:
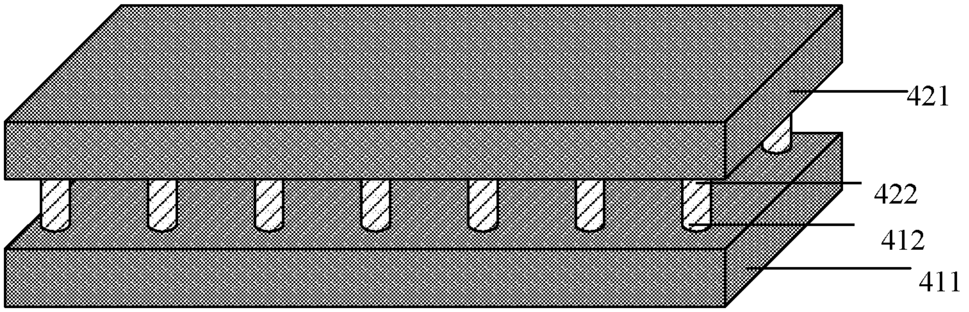
Figure 9H:
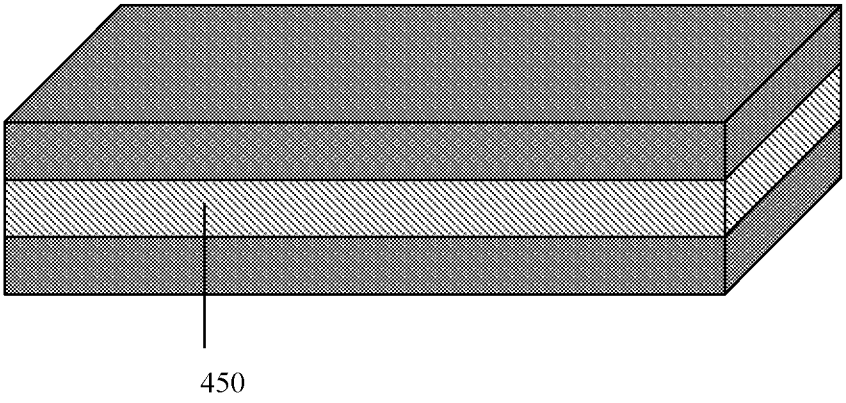

In operation S205, referring to FIGS. 9*f* to 9*h*, the heat conduction structure 460 is replaced with a filling layer 450, wherein a connection face of the first conductive pillar 412 and the second conductive pillar 422 is located in the filling layer 450.

In some examples, referring to FIG. 9*g*, the above fabrication method further comprises: removing the heat conduction structure 460, the third heat conduction layer 414, and the fourth heat conduction layer 424 to form a gap between the first dielectric layer 411 and the second dielectric layer 421; and filling the gap with a filling material to form the filling layer 450.

A material of the filling layer 450 comprises materials with good fluidity, such as at least one or a combination of epoxy resin, polyimide, or silica gel.

Based on the above-mentioned memory, the present disclosure further provides a memory system comprising:

- the memory as described in any one of the above examples; and
- a memory controller coupled to the memory and configured to control the memory.

The memory system comprises a mobile phone, a laptop computer, a tablet, a vehicle computer, a gaming console, a printer, a positioning device, a wearable electronic device, a smart sensor, a virtual reality (VR) device, an augmented reality (AR) device, or other suitable electronic devices having memory therein.

In some examples, the memory controller is designed for operating in a low duty-cycle environment like secure digital (SD) cards, compact flash (CF) cards, universal serial bus (USB) flash drives, or other media for use in electronic devices, such as personal computers, digital cameras, mobile phones, etc.

In other examples, the memory controller is designed for operating in a high duty-cycle environment, such as solid-state drives (SSDs) or embedded multi-media cards (eMMCs) used as data memory for mobile devices, such as smartphones, tablets, laptop computers, etc., and enterprise storage arrays.

The memory controller may be configured to control operations of the memory, such as read, erase, and program operations. The memory controller may be further configured to manage various functions with respect to data stored or to be stored in the memory including, but not limited to bad-block management, garbage collection, logical-to-physical address conversion, wear leveling, etc. In some examples, the memory controller is further configured to process error correction codes with respect to the data read from or written to the memory.

The memory controller may further perform any other suitable functions as well, for example, formatting the memory. The memory controller may communicate with an external device (e.g., a host) according to a particular communication protocol. For example, the memory controller may communicate with the external device through at least one of various interface protocols, such as a USB protocol, an MMC protocol, a peripheral component interconnection protocol, a PCI-express protocol, an advanced technology attachment protocol, a serial protocol, a parallel protocol, a small computer small interface protocol, an enhanced small disk interface protocol, an integrated drive electronics protocol, a Firewire protocol, etc.

The memory controller and one or more memory can be integrated into various types of storage devices, for example, be included in the same package, such as a universal flash storage (UFS) package or an eMMC package.

Based on the above-mentioned memory system, examples of present disclosure further provide an electronic device comprising: the memory system as described in the above example; and a host coupled to the memory system.

The electronic device comprises a mobile phone, a desktop computer, a tablet, a notebook, a server, a vehicle device, a wearable device or a mobile power supply, etc.

The host may be a processor of an electronic device, such as a central processing unit (CPU), or a system-on-chip (SOC), such as an application processor (AP). The host may be configured to send data to the memory. Alternatively, the host may be configured to receive data from the memory.

According to a first aspect of examples of the present disclosure, a memory is provided. The memory comprises a first semiconductor structure and a second semiconductor structure that are bonded to each other, wherein the first semiconductor structure comprises a first dielectric layer and a first conductive pillar located in the first dielectric layer, the second semiconductor structure comprises a second dielectric layer and a second conductive pillar located in the second dielectric layer, and the second conductive pillar is connected with the first conductive pillar;

- the memory further comprises a heat dissipation channel located in at least one of the first dielectric layer or the second dielectric layer, wherein the heat dissipation channel is disposed as being spaced apart from at least one of the first conductive pillar or the second conductive pillar.

In some examples, the heat dissipation channel comprises:

- a first heat dissipation channel located in the first dielectric layer and disposed as being spaced apart from the first conductive pillar; and
- a second heat dissipation channel located in the second dielectric layer and disposed as being spaced apart from the second conductive pillar, wherein the second heat dissipation channel is communicated with the first heat dissipation channel.

In some examples, the first semiconductor structure comprises a plurality of the first conductive pillars; the second semiconductor structure comprises a plurality of the second conductive pillars;

the heat dissipation channel comprises:

- at least one the first heat dissipation channel located between two adjacent ones of the first conductive pillars; and
- at least one the second heat dissipation channel located between two adjacent ones of the second conductive pillars.

In some examples, the heat dissipation channel further comprises:

at least one third heat dissipation channel located in the first dielectric layer and between two adjacent ones of the first conductive pillars, wherein an extension direction of the third heat dissipation channel intersects an extension direction of the first heat dissipation channel; and at least one fourth heat dissipation channel located in the second dielectric layer and between two adjacent ones of the second conductive pillars, wherein the fourth heat dissipation channel is communicated with the third heat dissipation channel, and an extension direction of the fourth heat dissipation channel intersects an extension direction of the second heat dissipation channel.

In some examples, the heat dissipation channel comprises a plurality of annular sub-channels connected sequentially;

the memory comprises first regions located inside the annular sub-channels and second regions located outside the annular sub-channels, wherein the connected first conductive pillar and second conductive pillar are located in the first regions;

and/or the connected first conductive pillar and second conductive pillar are located in the second regions.

In some examples, the heat dissipation channel comprises a gap or a plastic molding dielectric.

According to a second aspect of examples of the present disclosure, a memory is provided. The memory comprises a first semiconductor structure and a second semiconductor structure that are bonded to each other, wherein the first semiconductor structure comprises a first dielectric layer and a first conductive pillar partially located in the first dielectric layer, the second semiconductor structure comprises a second dielectric layer and a second conductive pillar partially located in the second dielectric layer, and the second conductive pillar is connected with the first conductive pillar;

the memory further comprises a filling layer located between the first dielectric layer and the second dielectric layer, wherein a connection face of the first conductive pillar and the second conductive pillar is located in the filling layer.

In some examples, the first conductive pillar comprises a first conductive sub-pillar and a second conductive sub-pillar, the first conductive sub-pillar is located in the first dielectric layer, the second conductive sub-pillar is located in the filling layer; the second conductive pillar comprises a third conductive sub-pillar and a fourth conductive sub-pillar, the third conductive sub-pillar is located in the second dielectric layer, the fourth conductive sub-pillar is located in the filling layer.

According to a third aspect of examples of the present disclosure, a fabrication method of a memory is provided, which comprises:

forming a first semiconductor structure, wherein the first semiconductor structure comprises a first dielectric layer and a first conductive pillar located in the first dielectric layer;

forming a second semiconductor structure, wherein the second semiconductor structure comprises a second dielectric layer and a second conductive pillar located in the second dielectric layer;

forming a heat dissipation channel, wherein the heat dissipation channel is located in at least one of the first dielectric layer or the second dielectric layer, and the heat dissipation channel is disposed as being spaced apart from at least one of the first conductive pillar or the second conductive pillar; and after forming the heat dissipation channel, bonding the second semiconductor structure and the first semiconductor structure, with the second conductive pillar being connected with the first conductive pillar.

According to a fourth aspect of examples of the present disclosure, a fabrication method of a memory is provided, which comprises:

forming a first semiconductor structure, wherein the first semiconductor structure comprises a first dielectric layer, a first heat conduction layer covering the first dielectric layer, and a first conductive pillar located in the first dielectric layer and the first heat conduction layer;

forming a second semiconductor structure, wherein the second semiconductor structure comprises a second dielectric layer, a second heat conduction layer covering the second dielectric layer, and a second conductive pillar located in the second dielectric layer and the second heat conduction layer;

forming a heat dissipation channel, wherein the heat dissipation channel is located in at least one of the first heat conduction layer or the second heat conduction layer, and the heat dissipation channel is disposed as being spaced apart from at least one of the first conductive pillar or the second conductive pillar;

after forming the heat dissipation channel, bonding the second semiconductor structure and the first semiconductor structure, with the second conductive pillar being connected with the first conductive pillar, and the second heat conduction layer being connected with the first heat conduction layer to form a heat conduction structure; and replacing the heat conduction structure with a filling layer, wherein a connection face of the first conductive pillar and the second conductive pillar is located in the filling layer.

In some examples, the fabrication method further comprises:

introducing a heat dissipation medium into the heat dissipation channel.

In some examples, the fabrication method further comprises:

controlling a flow rate of the introduced heat dissipation medium according to a temperature of at least one of the first semiconductor structure and the second semiconductor structure.

In some examples, the heat dissipation medium comprises a gas or a liquid.

In some examples, the forming the heat dissipation channel comprises:

forming a first heat dissipation channel located in the first dielectric layer and disposed as being spaced apart from the first conductive pillar; and forming a second heat dissipation channel located in the second dielectric layer and disposed as being spaced apart from the second conductive pillar, wherein the second heat dissipation channel is communicated with the first heat dissipation channel.

In some examples, the fabrication method further comprises:

forming a plastic molding dielectric in the communicated first heat dissipation channel and second heat dissipation channel.

In some examples, the forming the heat dissipation channel comprises:

forming a first heat dissipation channel located in the first heat conduction layer and disposed as being spaced apart from the first conductive pillar; and forming a second heat dissipation channel located in the second heat conduction layer and disposed as being spaced apart from the second conductive pillar, wherein the second heat dissipation channel is communicated with the first heat dissipation channel.

In some examples, the fabrication method further comprises:

forming a third heat conduction layer in the first heat dissipation channel, with a bottom of the third heat conduction layer being located in the first heat conduction layer; and forming a fourth heat conduction layer in the second heat dissipation channel, with a bottom of the fourth heat conduction layer being located in the second heat conduction layer, wherein after bonding the second semiconductor structure and the first semiconductor structure, the third heat conduction layer is connected with the fourth heat conduction layer.

In some examples, the fabrication method further comprises:

removing the heat conduction structure, the third heat conduction layer, and the fourth heat conduction layer to form a gap in the first dielectric layer and the second dielectric layer; and filling the gap with a filling material to form the filling layer.

In some examples, the forming the first semiconductor structure comprises:

forming a first via penetrating through the first dielectric layer;

forming a first conductive sub-pillar in the first via;

performing electroplating on the first conductive sub-pillar to form a second conductive sub-pillar, wherein the first conductive pillar comprises the first conductive sub-pillar and the second conductive sub-pillar; and after forming the second conductive sub-pillar, forming the first heat conduction layer covering the first dielectric layer;

the forming the second semiconductor structure comprises:

forming a second via penetrating through the second dielectric layer;

forming a third conductive sub-pillar in the second via;

performing electroplating on the third conductive sub-pillar to form a fourth conductive sub-pillar, wherein the second conductive pillar comprises the third conductive sub-pillar and the fourth conductive sub-pillar; and after forming the fourth conductive sub-pillar, forming the second heat conduction layer covering the second dielectric layer.

In some examples, the forming the first semiconductor structure comprises:

forming a first dielectric material layer covering a first substrate;

forming a first via penetrating through first dielectric material layer;

forming the first conductive pillar in the first via;

removing part of the first dielectric material layer along a direction facing the first substrate, with the remaining first dielectric material layer constituting the first dielectric layer; and forming the first heat conduction layer covering the first dielectric layer;

the forming the second semiconductor structure comprises:

forming a second dielectric material layer covering a second substrate;

forming a second via penetrating through the second dielectric material layer;

forming the second conductive pillar in the second via;

removing part of the second dielectric material layer along a direction facing the second substrate, with the remaining second dielectric material layer constituting the second dielectric layer; and forming the second heat conduction layer covering the second dielectric layer.

According to a fifth aspect of examples of the present disclosure, a memory system is provided, which comprises:

at least one memory as described in any one of the above examples; and a memory controller coupled to the memory and configured to control the memory.

According to a sixth aspect of examples of the present disclosure, an electronic device is provided, which comprises:

the memory system as described in the above example; and a host coupled to the memory system.

In the examples of the present disclosure, the heat dissipation channel spaced apart from the first conductive pillar is disposed in the first dielectric layer of the first semiconductor structure, and/or the heat dissipation channel spaced apart from the second conductive pillar is disposed in the second dielectric layer of the second semiconductor structure, such that the memory may undergo the heat dissipation timely and effectively through the heat dissipation channel, thereby facilitating a reduction of damage to a circuit in the memory caused by a high temperature and ensuring the working stability of the memory.

The above descriptions are merely specific implementations of the present disclosure, but the protection scope of the present disclosure is not limited thereto. Any variation or replacement that may be readily figured out by those skilled in the art within the technical scope disclosed by the present disclosure shall fall within the protection scope of the present disclosure. Therefore, the protection scope of the present disclosure shall be defined by the protection scope of the claims.

What is claimed is:

1. A memory comprising:

a first semiconductor structure and a second semiconductor structure that are bonded to each other at a first conductive pillar and a second conductive pillar, the first semiconductor structure comprising a first dielectric layer and the first conductive pillar, the first conductive pillar located in the first dielectric layer, the second semiconductor structure comprising a second dielectric layer and the second conductive pillar, the second conductive pillar located in the second dielectric layer; and a heat dissipation channel located between the first dielectric layer and the second dielectric layer, the heat dissipation channel traversing a plane along which the second conductive pillar and the first conductive pillar are bonded, the heat dissipation channel spaced apart from at least one of the first conductive pillar or the second conductive pillar.

2. The memory of claim 1, wherein the heat dissipation channel comprises:

a first heat dissipation channel located in the first dielectric layer and spaced apart from the first conductive pillar; and a second heat dissipation channel located in the second dielectric layer and spaced apart from the second conductive pillar, the second heat dissipation channel communicated with the first heat dissipation channel.

3. The memory of claim 2, wherein:

the first semiconductor structure comprises a plurality of first conductive pillars;

the second semiconductor structure comprises a plurality of second conductive pillars; and the heat dissipation channel comprises:

at least the first heat dissipation channel located between two adjacent ones of the plurality of the first conductive pillars; and at least the second heat dissipation channel located between two adjacent ones of the plurality of the second conductive pillars.

4. The memory of claim 3, wherein the heat dissipation channel further comprises:

a third heat dissipation channel located in the first dielectric layer and between the two adjacent ones of the plurality of first conductive pillars, an extension direction of the third heat dissipation channel intersecting an extension direction of the first heat dissipation channel; and a fourth heat dissipation channel located in the second dielectric layer and between the two adjacent ones of the plurality of second conductive pillars, the fourth heat dissipation channel communicated with the third heat dissipation channel, an extension direction of the fourth heat dissipation channel intersecting an extension direction of the second heat dissipation channel.

5. The memory of claim 1, wherein the heat dissipation channel comprises a plurality of annular sub-channels connected sequentially, the memory comprises first regions and second regions, respective ones of the first regions are located inside respective ones of the plurality of annular sub-channels, the second regions are located outside the plurality of annular sub-channels, and at least one of:

the first conductive pillar and the second conductive pillar are located in one of the first regions; and the first conductive pillar and the second conductive pillar are located in one of the second regions.

6. The memory of claim 1, wherein the heat dissipation channel comprises a gap or a plastic molding dielectric.

7. A memory comprising:

a first semiconductor structure and a second semiconductor structure that are bonded to each other, the first semiconductor structure comprising a first dielectric layer and a first conductive pillar partially located in the first dielectric layer, the second semiconductor structure comprising a second dielectric layer and a second conductive pillar partially located in the second dielectric layer, the second conductive pillar connected with the first conductive pillar; and a filling layer located between the first dielectric layer and the second dielectric layer, the filling layer comprising a material capable of flowing into a gap between the first dielectric layer and the second dielectric layer, corresponding connection faces of the first conductive pillar and the second conductive pillar located in the filling layer.

8. The memory of claim 7, wherein the first conductive pillar comprises a first conductive sub-pillar and a second conductive sub-pillar, the first conductive sub-pillar located in the first dielectric layer, the second conductive sub-pillar located in the filling layer.

9. The memory of claim 8, wherein the second conductive pillar comprises a third conductive sub-pillar and a fourth conductive sub-pillar, the third conductive sub-pillar located in the second dielectric layer, and the fourth conductive sub-pillar located in the filling layer.

10. A fabrication method of a memory, the fabrication method comprising:

forming a first semiconductor structure, the first semiconductor structure comprising a first dielectric layer, a first heat conduction layer covering the first dielectric layer, and a first conductive pillar located in the first dielectric layer and the first heat conduction layer;

forming a second semiconductor structure, the second semiconductor structure comprising a second dielectric layer, a second heat conduction layer covering the second dielectric layer, and a second conductive pillar located in the second dielectric layer and the second heat conduction layer;

forming a heat dissipation channel, the heat dissipation channel located in at least one of the first heat conduction layer or the second heat conduction layer, the heat dissipation channel spaced apart from at least one of the first conductive pillar or the second conductive pillar;

after forming the heat dissipation channel, bonding the second semiconductor structure and the first semiconductor structure, with the second conductive pillar being connected with the first conductive pillar and the second heat conduction layer being connected with the first heat conduction layer to form a heat conduction structure; and replacing the heat conduction structure with a filling layer, corresponding connection faces of the first conductive pillar and the second conductive pillar located in the filling layer.

11. The fabrication method of claim 10, further comprising introducing a heat dissipation medium into the heat dissipation channel.

12. The fabrication method of claim 11, further comprising controlling a flow rate of the heat dissipation medium according to a temperature of at least one of the first semiconductor structure and the second semiconductor structure.

13. The fabrication method of claim 11, wherein the heat dissipation medium comprises a gas or a liquid.

14. The fabrication method of claim 10, wherein forming the heat dissipation channel comprises:

forming a first heat dissipation channel located in the first dielectric layer and spaced apart from the first conductive pillar; and forming a second heat dissipation channel located in the second dielectric layer and spaced apart from the second conductive pillar, the second heat dissipation channel communicated with the first heat dissipation channel.

15. The fabrication method of claim 14, further comprising forming a plastic molding dielectric in the first heat dissipation channel and the second heat dissipation channel.

16. The fabrication method of claim 10, wherein forming the heat dissipation channel comprises:

forming a first heat dissipation channel located in the first heat conduction layer and spaced apart from the first conductive pillar; and forming a second heat dissipation channel located in the second heat conduction layer and spaced apart from the second conductive pillar, the second heat dissipation channel communicated with the first heat dissipation channel.

17. The fabrication method of claim 16, further comprising:

forming a third heat conduction layer in the first heat dissipation channel, a bottom of the third heat conduction layer being located in the first heat conduction layer; and forming a fourth heat conduction layer in the second heat dissipation channel, a bottom of the fourth heat conduction layer being located in the second heat conduction layer, the third heat conduction layer being connected with the fourth heat conduction layer after bonding of the second semiconductor structure and the first semiconductor structure.

18. The fabrication method of claim 17, further comprising:

removing the heat conduction structure, the third heat conduction layer, and the fourth heat conduction layer to form a gap in the first dielectric layer and the second dielectric layer; and filling the gap with a filling material to form the filling layer.

19. The fabrication method of claim 10, wherein:

forming the first semiconductor structure comprises:

forming a first via penetrating through the first dielectric layer;

forming a first conductive sub-pillar in the first via;

performing electroplating on the first conductive sub-pillar to form a second conductive sub-pillar, the first conductive pillar comprising the first conductive sub-pillar and the second conductive sub-pillar; and after forming the second conductive sub-pillar, forming the first heat conduction layer covering the first dielectric layer; and forming the second semiconductor structure comprises:

forming a second via penetrating through the second dielectric layer;

forming a third conductive sub-pillar in the second via;

performing electroplating on the third conductive sub-pillar to form a fourth conductive sub-pillar, the second conductive pillar comprising the third conductive sub-pillar and the fourth conductive sub-pillar; and after forming the fourth conductive sub-pillar, forming the second heat conduction layer covering the second dielectric layer.

20. The fabrication method of claim 10, wherein:

forming the first semiconductor structure comprises:

forming a first dielectric material layer covering a first substrate;

forming a first via penetrating through the first dielectric material layer;

forming the first conductive pillar in the first via;

removing a first portion of the first dielectric material layer along a direction facing the first substrate a first remaining portion of the first dielectric material layer constituting the first dielectric layer; and forming the first heat conduction layer covering the first dielectric layer; and forming the second semiconductor structure comprises:

forming a second dielectric material layer covering a second substrate;

forming a second via penetrating through the second dielectric material layer;

forming the second conductive pillar in the second via;

removing a second portion of the second dielectric material layer along a direction facing the second substrate a second remaining portion of the second dielectric material layer constituting the second dielectric layer; and forming the second heat conduction layer covering the second dielectric layer.

* * * * *